US011276468B2

(12) United States Patent
Ayyapureddi

(10) Patent No.: US 11,276,468 B2
(45) Date of Patent: Mar. 15, 2022

(54) HIGH-SPEED EFFICIENT LEVEL SHIFTER

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/944,568

(22) Filed: Jul. 31, 2020

(65) Prior Publication Data

US 2022/0036955 A1    Feb. 3, 2022

(51) Int. Cl.
| | |
|---|---|
| *G11C 16/26* | (2006.01) |
| *G11C 16/12* | (2006.01) |
| *H03K 19/017* | (2006.01) |
| *H03K 19/0185* | (2006.01) |
| *G11C 16/04* | (2006.01) |

(52) U.S. Cl.
CPC .......... *G11C 16/12* (2013.01); *G11C 16/0433* (2013.01); *G11C 16/26* (2013.01); *H03K 19/01721* (2013.01); *H03K 19/018564* (2013.01)

(58) Field of Classification Search
CPC ..... G11C 16/12; G11C 16/0433; G11C 16/26; H03K 19/01721; H03K 19/018564
See application file for complete search history.

(56) References Cited

U.S. PATENT DOCUMENTS

| | | | |
|---|---|---|---|
| 6,002,290 A | 12/1999 | Avery et al. | |
| 6,930,622 B2* | 8/2005 | Brede | H03K 3/356113 326/83 |
| 2004/0246024 A1 | 12/2004 | Brede et al. | |
| 2019/0081622 A1* | 3/2019 | Yagi | H03K 19/017 |

OTHER PUBLICATIONS

U.S. Appl. No. 16/781,875, filed Feb. 4, 2020, Daniel B. Penney.

* cited by examiner

*Primary Examiner* — Xiaochun L Chen
(74) *Attorney, Agent, or Firm* — Fletcher Yoder, P.C.

(57) ABSTRACT

Embodiments disclosed herein relate to level shifters of a memory device. Specifically, the level shifters include a first series arrangement of transistors to offset a first transistor. The level shifters also include a second series arrangement of transistors to offset a second transistor. The first series arrangement is opposite the second series arrangement. The output of the first series arrangement is coupled to a first pull-up transistor and configured to cut off a pull-up of the first pull-up transistor to a first voltage. The output of the second series arrangement is coupled to a second pull-up transistor and configured to cut off a pull-up of the second pull-up transistor to the first voltage. The first series arrangement and the second series arrangement are coupled to a second voltage at different times. The series arrangements of transistors enable faster level shifting over conventional level shifters.

20 Claims, 6 Drawing Sheets

HIGH-SPEED EFFICIENT LEVEL SHIFTER

BACKGROUND

Field of the Present Disclosure

Embodiments of the present disclosure relate generally to the field of semiconductor devices. More specifically, embodiments of the present disclosure relate to a high-speed efficient voltage level shifter.

Description of Related Art

Semiconductor devices (e.g., memory devices) may utilize a level shifter. For instance, dynamic random-access memory (DRAM) devices may use a level shifter to allow compatibility between integrated circuits (ICs) of the DRAM devices. For example, a first IC of a DRAM device may utilize a first voltage (about 1.8 volts) while a second IC of the DRAM device utilizes a second voltage (3.3 volts). In order for the first and second ICs to be compatible for use in the same DRAM device, a level shifter may increase an output of the first IC to the second voltage for use by the second IC. However, level shifters may be speed limited and unsuitable for some high-speed operations.

Embodiments of the present disclosure may be directed to address one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices exchange data and store the data in memory banks. For data to flow through the memory devices, level shifters may be used to ensure proper shifting between voltage levels for the various ICs, or within an IC, of the memory devices. Embodiments disclosed herein provide improved performance and increased speed compared to conventional level shifters.

Figure 1:
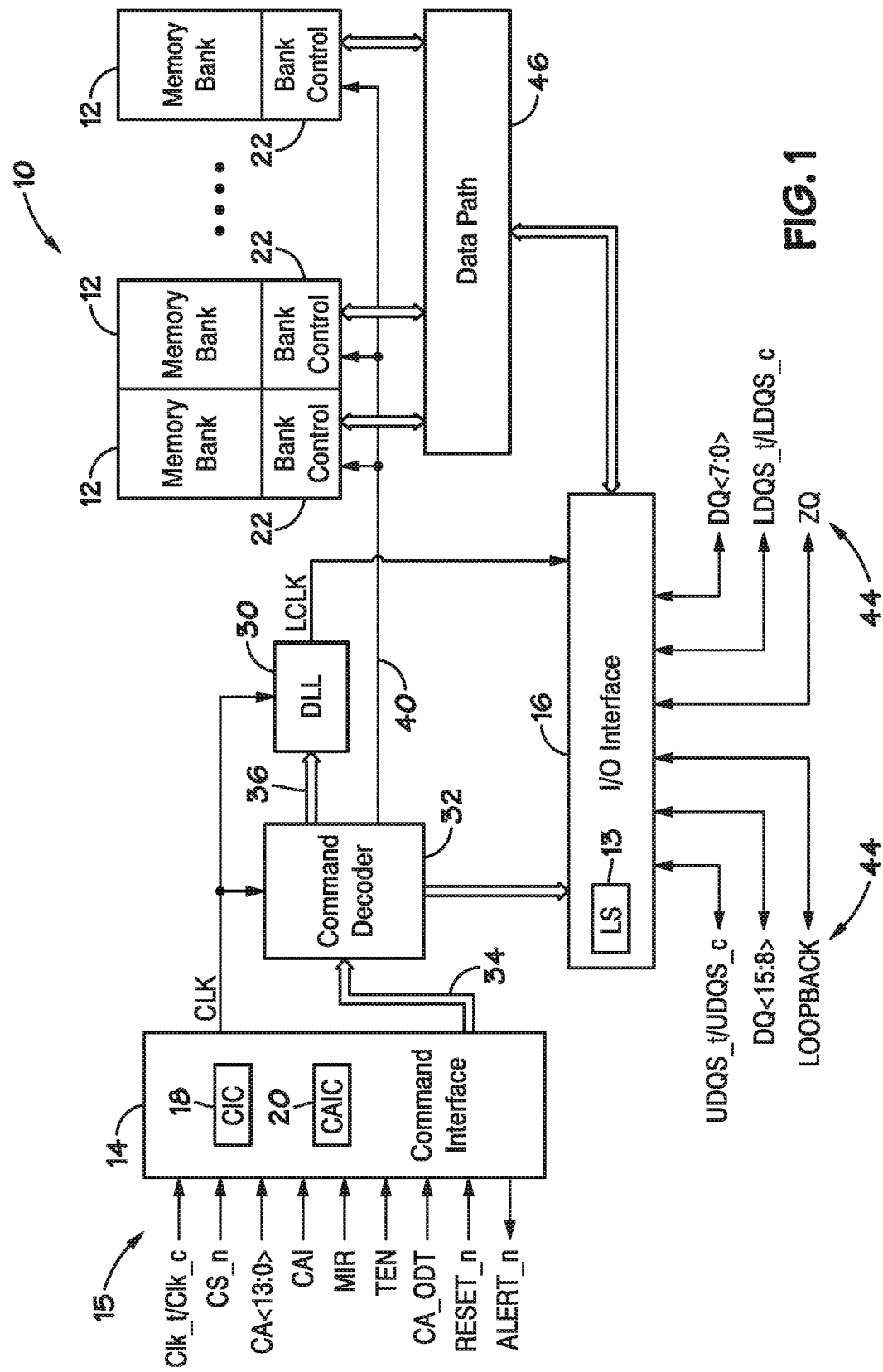
FIG. 1 is a simplified block diagram illustrating some features of a memory device, according to an embodiment of the disclosure.

FIG. 1 is a simplified block diagram illustrating some features of a memory device 10. In accordance with one embodiment, the memory device 10 may be a double data rate type five synchronous dynamic random access memory (DDR5 SDRAM) device. Various features of DDR5 SDRAM allow for reduced power consumption, increased bandwidth, and increased storage capacity compared to prior generations of DDR SDRAM. The memory device 10 represents a portion of a single memory chip (e.g., SDRAM chip) having a number of memory banks 12. The memory banks 12 may be, for example, DDR5 SDRAM memory banks. The memory banks 12 may be disposed on one or more chips (e.g., SDRAM chips) arranged on dual inline memory modules (DIMMS). Each DIMM may include a number of SDRAM memory chips (e.g., eight or sixteen memory chips). Each SDRAM memory chip may include one or more memory banks 12.

For DDR5, the memory banks 12 may be arranged to form bank groups. For example, the memory chip may include sixteen memory banks 12 for an eight gigabyte (8 Gb) DDR5 SDRAM. The memory banks 12 may be arranged into eight memory bank groups, each memory bank group including two memory banks. For a sixteen gigabyte (16 Gb) DDR5 SDRAM, the memory chip may include thirty-two memory banks 12, arranged into eight memory bank groups, each memory bank group including four memory banks 12, for instance.

Various other configurations, organizations, and sizes of the memory banks 12 on the memory device 10 may be utilized depending on the application and design of the overall system. In one embodiment, each memory bank 12 includes a bank control block 22, which controls execution of commands to and from the memory banks 12 for performing various functionality in the memory device, such as decoding, timing control, data control, and any combination thereof.

The memory device 10 may include a level shifter 13 that changes between an input voltage and an output voltage. The illustrated level shifter 13 may be located in an input/output (I/O) interface 16. Additionally or alternatively, the level shifter 13 may be located in other components of the memory device 10, such as a datapath 46 or a command interface 14. In some embodiments, the level shifter 13 may be located in more than one component and/or may be located between components of the memory device 10. Furthermore, in some embodiments, the level shifter 13 may be used in other electronic devices other than the memory device 10.

The command interface 14 of the memory device 10 is configured to receive and transmit a number of signals (e.g., signals 15). The signals 15 may be received from an external device (not shown), such as a processor or controller. The processor or controller may provide various signals 15 to the memory device 10 to facilitate transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the bar clock signal (Clk_c). A positive clock edge for DDR refers to the point where a rising true clock signal Clk_t/crosses a falling bar clock signal Clk_c. A negative clock edge indicates a transition of a falling true clock signal Clk_t and a rising of the bar clock signal Clk_c. Commands (e.g., read command, write command, etc.) are typically entered on the positive edges of the clock signal. Data may be transmitted or received on both the positive and the negative clock edges.

The clock input circuit 18 receives the true clock signal (Clk_t/) and the bar clock signal (Clk_c) and generates an internal clock signal, CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, as discussed below, the clock input circuit 18 may include circuitry that splits the clock signal into multiple (e.g., four) phases. The clock input circuit 18 may also include phase detection circuitry to detect which phase receives a first pulse when sets of pulses occur too frequently to enable the clock input circuit 18 to reset between pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command via the bus path 40. As will be appreciated, the memory device 10 may include various other decoders, such as row decoders and column decoders, to facilitate access to the memory banks 12.

The memory device 10 executes operations, such as read commands and write commands, based on the command/address signals received from an external device, such as a processor. In one embodiment, the command/address bus 34 may be a 14-bit bus to accommodate the command/address signals (CA<13:0>). The command/address signals 15 are clocked to the command interface 14 using the clock signals (Clk_t/ and Clk_c). The command interface 14 may include a command address input circuit 20 which is configured to receive and transmit the commands to provide access to the memory banks 12 through the command decoder 32. In addition, the command interface 14 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus 34, for instance, depending on the command/address routing for the particular memory device 10. A mirror (MIR) signal may also be provided to facilitate a mirror function. The MIR signal may be used to multiplex signals so the signals can be swapped to enable certain routing of signals to the memory device 10, based on the configuration of multiple memory devices (such as memory device 10) in a particular application. Various signals to facilitate testing of the memory device 10, such as the test enable (TEN) signal, may be provided as well. For instance, the TEN signal may be used to place the memory device 10 into a test mode for connectivity testing.

The command interface 14 may also be used to provide an alert signal (ALERT_n) to the system processor or controller for errors that may be detected. For instance, the alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during some operations, such as the connectivity test mode executed using the TEN signal, as described above.

Data may be sent to and from the memory device 10, utilizing the command and clocking signals 15 discussed above, by transmitting and receiving data signals 44 through the I/O interface 16. More specifically, the data may be sent to or retrieved from the memory banks 12 over the datapath 46, which includes a plurality of bi-directional data buses. Data I/O signals, generally referred to as DQ signals, are generally transmitted and received in one or more bi-directional data busses. For particular memory devices, such as a DDR5 SDRAM memory device, the I/O signals may be divided into upper and lower bytes. For instance, for a x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, some memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals may be used as clock signals to capture the corresponding input data. As with the clock signals (Clk_t/ and Clk_c), the DQS signals may be provided as a differential pair of data strobe signals (DQS_t/ and DQS_b) to provide differential pair signaling during reads and writes. For some memory devices, such as a DDR5 SDRAM memory device, the differential pairs of DQS signals may be divided into upper and lower data strobe signals (e.g., UDQS_t/ and UDQS_b; LDQS_t/ and LDQS_b) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage, and temperature (PVT) values. Because PVT characteristics may affect the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/ VSS external to the memory device 10. This resistor acts as a reference for adjusting internal ODT and drive strength of the I/O pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is provided to highlight some functional features of the memory device 10 to aid in the subsequent detailed description. Furthermore, although the foregoing has discussed a DDR5 memory device, the level shifters discussed herein may be used any type of electronic device and/or other types of memory, such as a double-data rate type 4 DRAM (DDR4) memory device.

Figure 2:
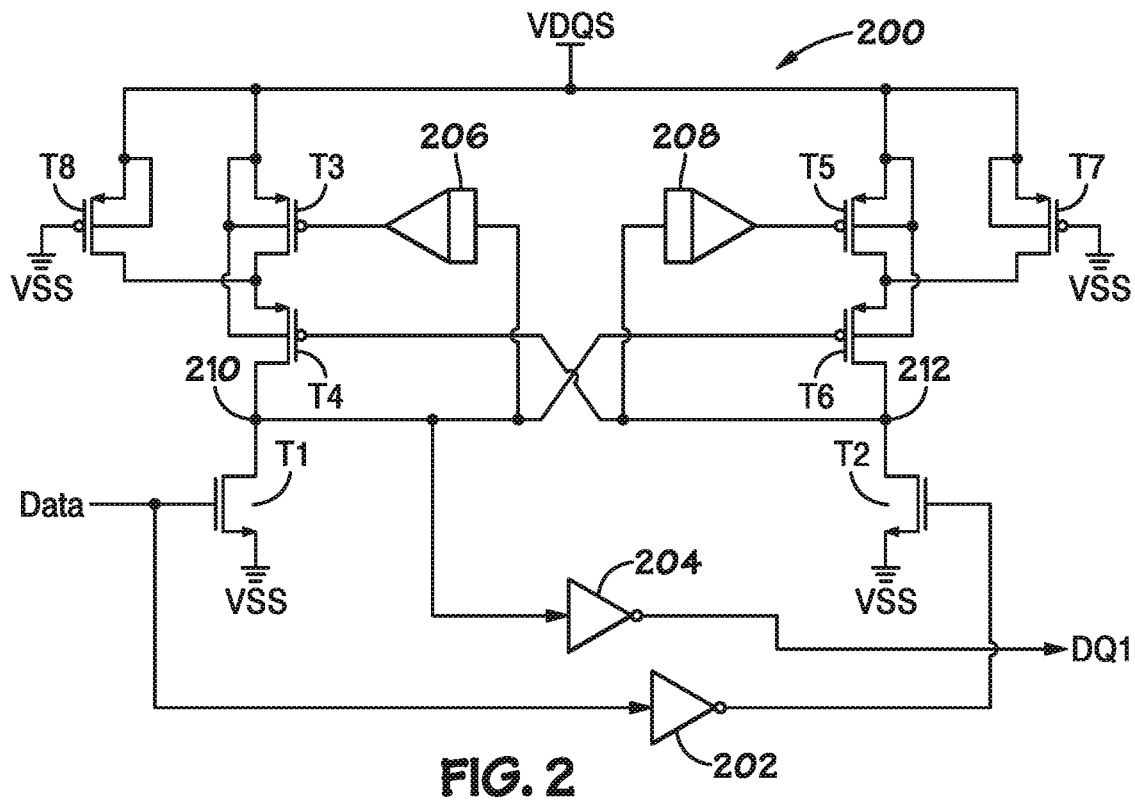
FIG. 2 is a circuit diagram of a voltage level shifter.

FIG. 2 is a circuit diagram of a voltage level shifter 200. The level shifter 200 may correspond to the level shifter 13 discussed with respect to FIG. 1. For example, the high-speed level shifter 200 may be located in the I/O interface 16, the datapath 46, the command interface 14, or any combination thereof.

As illustrated, the level shifter 200 includes transistors T1-T8, delay gates 206, 208, and inverters 202, 204. As illustrated, the transistors T1 and T2 may be n-channel transistors while the transistors T4-T6 may be p-channel transistors. Furthermore, the transistors T2 and T4 may be low-voltage transistors to enable fast propagation. Some p-channel transistors may be weak compared to the corresponding n-channel transistors. For instance, the transistors T7 and T8 are weak transistors and are always coupled to a logic low (e.g., 0, VSS) that may be rapidly overpowered by the respective transistors T1 and T2. It is to be understood that the transistors T1-T8 may be different types (n-channel or p-channel) and may be disposed in a different configuration than shown. The delay gates 206, 208 receive and delay a signal for a predetermined timed delay, such as about 100 ps, thereby holding a previous signal at a respective gate of transistors for the predetermined delay.

In the following example, the input signal DATA is assumed to be a logic high (e.g., 1) or transitioning from low to high (e.g., from 0 to 1), for the sake of discussion. The input signal DATA is coupled to the transistor T1 and the inverter 202. When the input signal DATA is received at a gate of the transistor T1 as a logic high, the transistor T1 pulls down a first node 210 to a logic low signal (e.g., 0, VSS). The first node 210 is also coupled to a gate of the transistor T6.

With the first node 210 coupled to the low signal, the transistor T6 couples a second node 212 to a logic high voltage (e.g., 1, VDQS) via the transistor T5 that has a logic low applied to its gate from a previous cycle of the input signal DATA. The second node 212 is coupled to the logic high voltage via the transistor T6 and the transistor T5 until a duration set by the delay gate 208 elapses after the transition of the input signal DATA. That is, after the duration of the delay gate 208 elapses, the transistor T5 decouples the second node 212 from the logic high. Thus, the signal from the delay gate 208 cuts off the voltage pull-up at the second node 212 via the transistor T5. Instead, after the initial pull-up, the transistor T6 is coupled to the logic high voltage via the relatively small transistor T7. As may be appreciated, the transistor T7 may be sufficiently sized to provide enough power to maintain the voltage at the second node 212 but small enough to enable the transistor T2 to pull the voltage of the second node 212 down to the low voltage despite the connection via the transistor T7.

For example, the delay gate 208 may receive a signal from the second node 212. The signal is delayed by the delay gate 208 at least until a voltage transition between logic low and logic high on the first node 210 and the second node 212 is complete and the predetermined delay has elapsed. As an example, the predetermined delay of the delay gate 208 may be about 100 ps.

The delay gate 206 operates in a similar fashion between the first node 210 and the transistor T3. In the current example, the second node 212 is a logic high after being pulled up via the transistor T5 and the transistor T6. Accordingly, the transistor T4 is turned off due to the logic high voltage applied to a gate of the transistor T4 from the second node 212. That is, the first node 210 is not coupled to the logic high at least via the transistor T4. After at least the predetermined delay, the delay gate 206 supplies a logic low signal via the transistor T1 to the transistor T3. That is, the transistor T3 provides a partial path from the high voltage (e.g., VDQS) to the first node 210 after at least the predetermined delay has elapsed.

Conversely, if the input signal DATA is a logic low (e.g., 0), the input signal is inverted by the first inverter 202 and provides a logic high to the transistor T2. The transistor T2 pulls down the second node 212 to logic low (e.g., 0, VSS). The logic low is applied to a gate of the transistor T4 that couples the first node 210 to a logic high voltage (e.g., 1, VDQS) via the transistor T3. The logic high is received by the delay gate 206 which, after the delay set by the delay gate 206 elapses, causes the transistor T3 to decouple the first node 210 from the logic high (e.g., 1, VDQS) via the transistor T3. Thus, as the input signal DATA cycles between logic high and logic low, the cut-off by the delay gate 206 creates a pulsed pull-up to logic high through the transistor T3 after the delay set by the delay gate 206. Instead, the connection of the logic high voltage to the first node 210 is passed through the relatively small transistor T8 that functions similarly to the transistor T7 with respect to the respective first node 210 and second node 212.

A first series arrangement of the transistors T5 and T6 provide a "burst" (i.e., fast) pull-up to the logic high (e.g., 1, VDQS) for a high input signal DATA. Similarly, a second series arrangement of the transistors T3 and T4 provide a "burst" pull-up to the logic high for a low input signal DATA. That is, the first and second series arrangements provide an increased speed to pull-up an output DQ1 of the level shifter 200 measured from the first node 210 and/or the second node 212. The speed at which the first and second series arrangements pull-up the output DQ1 is substantially symmetric to the pull down speed of the transistor T1 and the transistor T2. The inverter 204 may be disposed on the output line. The inverter 204 may act as a buffer amplifier to the output DQ1 to provide improved predictability of the output level between 0 and 1.

Based on the circuit diagram of the level shifter 200, a two-gate offset (e.g., two clock cycles) exists for the output DQ1 between a high input signal DATA and a low input signal DATA. In some embodiments, an additional complementary output (not shown) may be measured at the second node 212. Additionally or alternatively, a complementary output may be obtained by inverting the output DQ1 to obtain differential outputs for the high-speed level shifter 200. While the level shifter 200 may provide a fast voltage pull-up speed, the delay gates 206 and 208 significantly increase a physical size of the level shifter 200.

Figure 3:
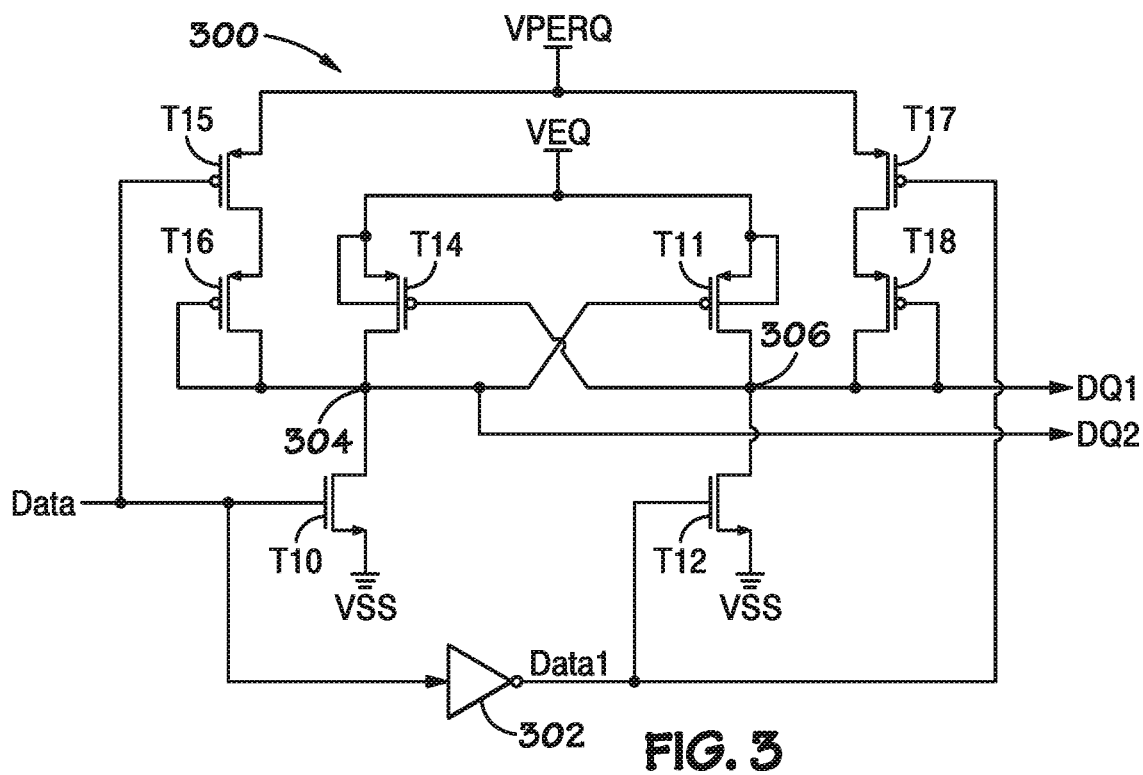
FIG. 3 is a circuit diagram of a high-speed efficient voltage level shifter, according to an embodiment of the disclosure.

FIG. 3 is a circuit diagram of a high-speed efficient voltage level shifter 300, according to an embodiment of the disclosure. The level shifter 300 may correspond to the level shifter 13 discussed with respect to FIG. 1. For example, the level shifter 300 may be located in the I/O interface 16, the datapath 46, the command interface 14, or any combination thereof. The level shifter 300 includes transistors T10-T18 and an inverter 302. As discussed above with respect to the level shifter 200, the transistors T10-T18 may be different types (e.g., n-channel or p-channel) and may be disposed in a different configuration than shown.

In the following example, the input signal DATA is assumed to be a logic high (e.g., 1) or transitioning from a logic low to a logic high (e.g., from 0 to 1), for the sake of discussion. The input signal DATA is applied to a gate of the transistor T10 which pulls a first node 304 down to a logic low signal (e.g., 0, VSS). With the first node 304 coupled to the low signal, the transistor T11 pulls up a second node 306 up to a logic high signal (e.g., 1, VEQ). Thus, the output DQ1 measured at the second node 306 is a logic high signal (e.g., 1, VEQ). In some embodiments, VPERQ is an internal voltage of about 1.2 volts. In some embodiments, which may include the embodiments described above, VEQ is an external voltage of about 1.3 volts.

A brief delay of about one clock cycle occurs when the input signal DATA transitions from low to high. For example, a signal at a gate of the transistor T17 transitions from high to low via the input signal DATA and the inverter 302. A gate of the transistor T18 is a logic low from the previous cycle of the input signal DATA via the second node 306. When the signal applied to the gate of the transistor T17 transitions to a logic low, the second node 306 is coupled to the internal voltage VPERQ via the transistors T17 and T18. When this pull-up occurs, the internal voltage VPERQ is applied to the gate of the transistor T14. Thus, the transistor T14 is turned off (or significantly weakened relative to the transistor T10) and the transistor T10 overpowers the pull-up of the transistor T14. That is, when the input signal transitions from low to high, the first node 304 is pulled down to a logic low voltage (e.g., 0, VSS) via the transistor T10 after the delay caused by the transition from high to low at the gate of the transistor T17. Thus, when the input signal DATA is a logic high (e.g., 1), the output DQ1 measured at the second node 306 is a logic high voltage (e.g., 1, VEQ) and the output DQ2 measured at the first node 304 is a logic low voltage (e.g., 0, VSS).

When the transistor T10 pulls the first node 304 to a logic low, the logic low signal is applied to the gate of the transistor T11 and the transistor T11 is turned on. At that time, the second node 306, and thus the output DQ1, is pulled up to a logic high (e.g., 1, VEQ) via the transistor T11.

The logic high signal at the second node 306 is applied to the gate of the transistor T18 via the transistor T11 and turns off the transistor T18.

Conversely, if the input signal DATA is a logic low (e.g., 0) or transitioning from high to low (e.g., from 1 to 0), the input signal DATA is inverted by the inverter 302 which provides a logic high to a gate of the transistor T12. The transistor T12 pulls down the second node 306 to a logic low (e.g., 0, VSS). The logic low is applied to a gate of the transistor T14 which couples the first node 304 to a logic high (e.g., 1, VEQ). The output DQ2 measured at the first node 304 is a logic high signal (e.g., 1, VEQ).

After a delay of about one clock cycle, the transistor T16 pulls up the first node 304 to a logic high (e.g., 1, VPERQ) via the transistor T15. For example, a logic low is applied to a gate of the transistor T16 from a previous cycle of the input signal DATA. A logic low signal is applied to a gate of the transistor T16 from a previous cycle of the input signal DATA. Thus, when the input signal DATA transitions from high to low, the transistor T16 couples the first node 304 to a logic high (e.g., the internal voltage VPERQ, 1) via the transistor T15.

The logic high signal at the first node 304 is applied to a gate of the transistor T11 which cuts off the pull-up of the second node 306 to the external voltage VEQ via the transistor T11. That is, the logic high signal to the gate of the transistor T11 via the first node 304 turns off or weakens the transistor T11 such that the transistor T12 overpowers the transistor T11. Thus, when the input signal DATA is a logic low (e.g., 0), the output DQ1 measured at the second node 306 is a logic low (e.g., 0, VSS) and the output DQ2 measured at the first node 304 is a logic high (e.g., 1, VEQ).

Advantageously, a first series arrangement of the transistors T17 and T18 modulates the pull-up of the first node 304 via the transistor T14 by providing a pulsed voltage (e.g., VPERQ) to the gate of the transistor T14 to turn off or weaken the transistor T14 (relative to the transistor T10). That is, the voltage applied to the gate of the transistor T14 cuts off the voltage pull-up of the transistor T14 such that the transistor T10 overpowers the transistor T14. Similarly, a second series arrangement of the transistors T15 and T16 modulates the pull-up of the second node 306 via the transistor T11 by providing a pulsed voltage (e.g., VPERQ) to the gate of the transistor T11 to turn off or weaken the transistor T11 (relative to the transistor T12). That is, the voltage applied to the gate of the transistor T11 cuts off the voltage pull-up by weakening the pull-up of the transistor T11 such that the transistor T12 overpowers the transistor T11.

The high-speed efficient voltage level shifter 300 generates a voltage pull-up to VEQ via the transistors T14 and T11, which is cut off by the first and second series arrangements of the transistors T17, T18 and T15, T16, respectively. The level shifter 300 provides an increased speed to pull-up and pull-down the outputs DQ1 and DQ2 while minimizing a physical size of the level shifter 300. Further, the level shifter 300 achieves the increased pull-up speed while consuming less power than alternative designs, such as the level shifter 200 discussed with respect to FIG. 2. A speed at which the transistors T14 and T11 pull-up the outputs DQ1 and DQ2 may be substantially symmetric to a pull-down speed of the transistors T10 and T12. In some embodiments, the output DQ2 is a complementary output of the output DQ1.

Additionally or alternatively, one or more buffers (not shown) may be disposed on the outputs DQ1 and DQ2 to protect electronics or equipment coupled thereto. As may be appreciated, the transistors T17, T18 and T15, T16 of the series arrangements may be sufficiently sized to provide enough power to maintain the voltage at the first node 304 and the second node 306, respectively, but small enough to pull the voltage of the nodes 304, 306 down to the low voltage despite the connection to the internal voltage VPERQ via the transistors T17, T18 and T15, T16, respectively.

Figure 4:
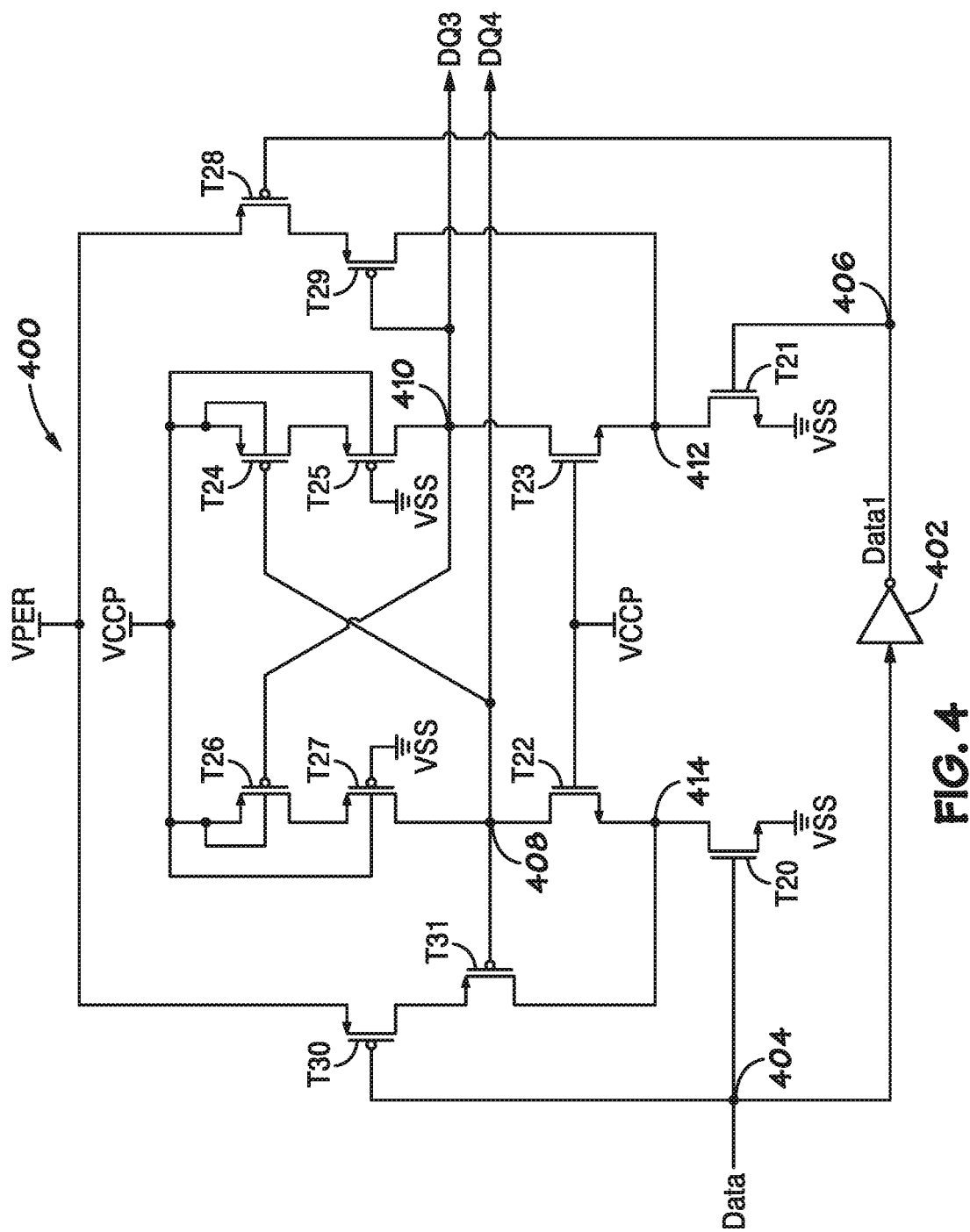
FIG. 4 is a circuit diagram of a high-speed efficient level shifter, according to a second embodiment of the disclosure.

FIG. 4 is a circuit diagram of an alternative high-speed efficient level shifter 400, according to an embodiment of the disclosure. The level shifter 400 may be used, for example, as a VCCP voltage level shifter. The level shifter 400 may correspond to the level shifter 13 discussed with respect to FIG. 1. For example, the high-speed level shifter 400 may be located in the I/O interface 16, the datapath 46, the command interface 14, or any combination thereof.

Physical degradation of a transistor may occur when a source and/or drain of the transistor is in a transition phase between a low voltage and a high voltage. The level shifter 400 reduces a length of time one or more pull-down transistors, such as transistors T20-T23, are in a transition phase. Thus, the level shifter 400 reduces degradation of the pull-down transistors, which may prolong an operation life of the pull-down transistors. The level shifter 400 also increases a speed of the voltage pull-up and the voltage pull-down.

As illustrated, the level shifter 400 includes transistors T20-T31 and an inverter 402. An output DQ3 of the level shifter 400 may be measured at a third node 410 between the transistors T23 and T25. A complementary output DQ4 (e.g., opposite polarity of the output DQ3) may be measured at a fourth node 408 between the transistors T22 and T27. The transistors T20-T23 may be n-channel transistors and the transistors T24-T31 may be p-channel transistors. Some p-channel transistors may be weak compared to the corresponding n-channel transistors. It is to be understood that the transistors T20-T31 may be different types (n-channel or p-channel) and may be disposed in a different configuration than shown. In some embodiments, a source voltage VCCP is about 3 volts and an internal or nominal voltage is between about 1.1 volts and about 1.5 volts, such as about 1.2 volts.

In the following example, the input signal DATA is assumed to be a logic high (e.g., 1) or transitioning from low to high (e.g., from 0 to 1), for the sake of discussion. The gate of the transistor T20 receives the input signal DATA and couples a first node 414 to a logic low signal (e.g., 0, VSS). From a previous cycle of the input signal DATA, a gate of the transistor T29 is a logic low. Thus, the input signal DATA is inverted by the inverter 402 and the inverted input signal DATA1 is applied to a gate of the transistor T28. That is, the transistor T28 couples the second node 412 to a logic high voltage (e.g., 1, VPERQ).

From the previous cycle of the input signal DATA, the gate of the transistor T26 is a logic low. The logic high signal is applied to a gate of the transistor T26 via the transistor T23 and a third node 410. Thus, the gate of the transistor T26 transitions from a logic low voltage (e.g., 0 volts) to a logic high voltage (e.g., 1, VPERQ). From the previous cycle of the input signal DATA, the transistor T26 coupled a fourth node 408 to a logic high voltage (e.g., VCCP) via the transistor T27. The transition of the gate of the transistor T26 turns off or significantly weakens the transistor T26. Once the transistor T26 is weakened, pull-down transistors T20 and T22 quickly pull down the fourth node 408 to a logic low voltage (e.g., VSS).

Conversely, if the input signal DATA is a logic low (e.g., 0) or transitioning from high to low, the gate of the transistor T21 receives a logic high voltage (e.g., an inverse of the input signal DATA) via the inverter 402. Thus, the third node 410 is coupled to a logic low signal (e.g., 0, VSS). A gate of the transistor T31 is a logic low from a previous cycle of the input signal DATA. Thus, the input signal DATA at the gate of the transistor T30 pulls the first node 414 up to a logic high voltage (e.g., 1, VPERQ).

From the previous cycle of the input signal DATA, the gate of the transistor T24 is a logic low. The logic high signal at the first node 414 is applied to a gate of the transistor T24 via the fourth node 408. Thus, the gate of the transistor T24 transitions from a logic low voltage to a logic high voltage. The transition of the gate of the transistor T24 turns off or significantly the transistor T24, enabling a fast pull-down of the third node 410 via the pull-down transistors T21 and T23.

That is, the pull-down transistors T21 and T23 operate in a similar fashion as the pull-down transistors T20 and T22. For example, for a logic high input signal DATA, the transistors T22 and T20 pull down the fourth node 408 to a logic low voltage (e.g., 0, VSS). Similarly, for a logic low input signal DATA, the transistors T21 and T23 pull down the third node 410 to the logic low voltage.

The relatively fast pull-down of the third node 410 and the fourth node 408 reduces a transition time of the pull-down transistors T21, T23 and T20, T22, respectively, which may prolong a life of the pull-down transistors T20-T23. The pull-down transistors T20-T23 may be manufactured from a thick oxide to further reduce an amount of degradation caused by the transition from VCCP to VSS. A size of the pull-down transistors T20 and T21 may have a fifth size (e.g., a minimum width of about 11.25 micrometers and a minimum length of about 134 nanometers). The relatively large size of the pull-down transistors T20 and T21 may enable an increased speed of the pull-down to VSS, thus prolonging an operational life of the pull-down transistors T20 and T21.

Figure 5:
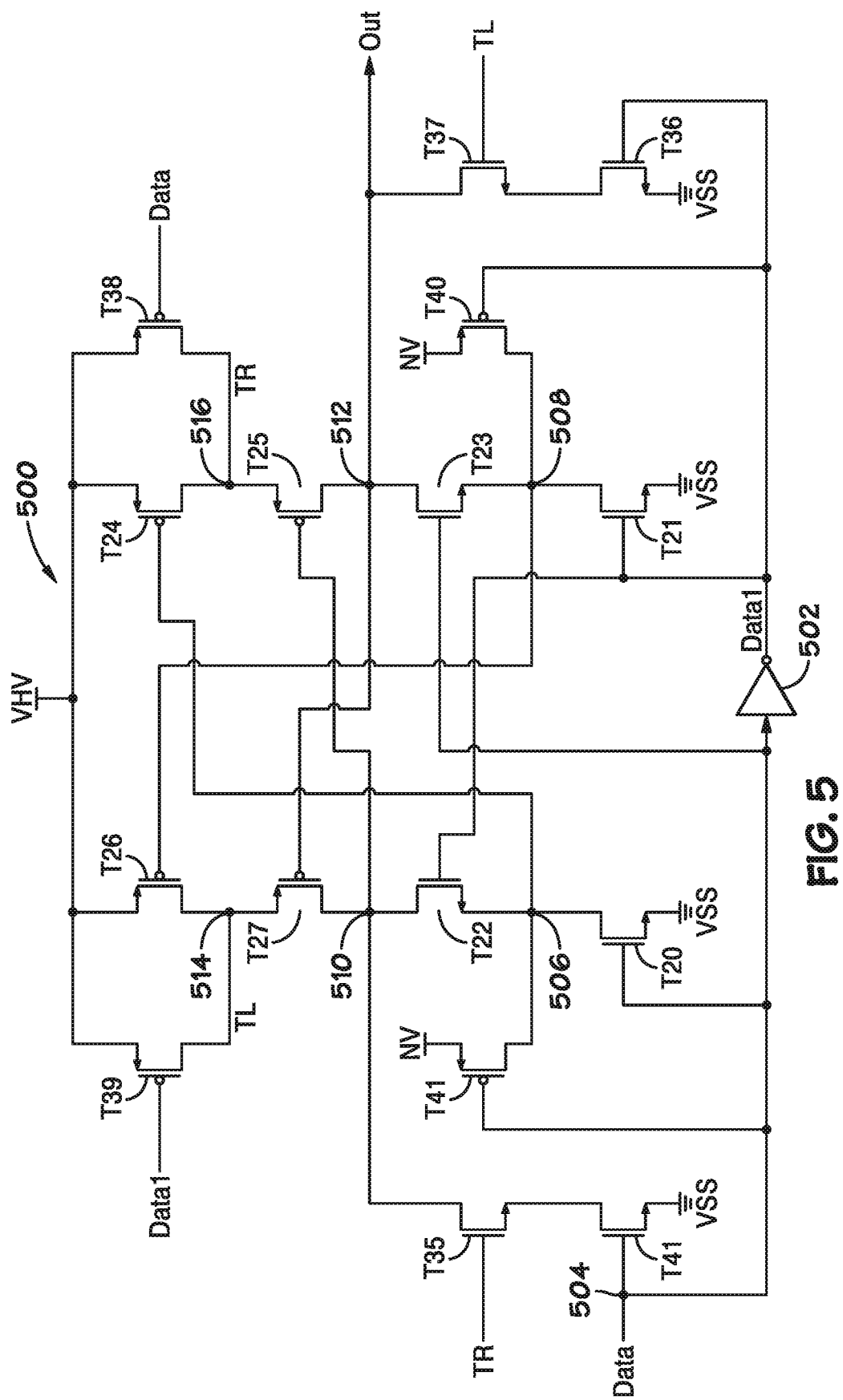
FIG. 5 is a circuit diagram of a high-speed efficient level shifter, according to a third embodiment of the disclosure.

FIG. 5 is a circuit diagram of an alternative high-speed efficient level shifter 500, according to an embodiment of the disclosure. The level shifter 500 may correspond to the level shifter 13 discussed with respect to FIG. 1. For example, the high-speed level shifter 500 may be located in the I/O interface 16, the datapath 46, the command interface 14, or any combination thereof.

The level shifter 500 may be used for a relatively large voltage shift, such as a shift between about 0 volts and about 3 volts. For example, the level shifter 500 may be used with the VCCP voltage discussed with respect to FIG. 4. In some embodiments, a source voltage VHV as discussed below is about 3 volts and a nominal voltage NV is between about 1.1 volts and about 1.5 volts, such as about 1.2 volts.

As illustrated, the level shifter 500 includes transistors T20-T27 which may correspond to the transistors T20-T27 discussed with respect to FIG. 4. The level shifter 500 also include transistors T34-T41 and an inverter 502. In some embodiments, transistors T38 and T39 may be relatively weak transistors compared to the respective pull-down transistors T20 and T21. An output OUT of the level shifter 500 may be measured from a first node 512 between the transistors T23 and T25. A complementary output OUT1 (not shown) may be measured at a second node 510 between the transistors T22 and T27.

In the following example, the input signal DATA is assumed to be a logic high signal (e.g., 1) or transitioning from low to high, for the sake of discussion. In that case, the transistor T20 couples a third node 506 to the logic low voltage (e.g., VSS). The transistor T22 is turned off which decouples the third node 506 from the second node 510. That is, the transistor T22 isolates the third node 506 from the second node 510.

The logic low voltage at the third node 506 is applied to a gate of the transistor T24. Thus, a fifth node 516 is coupled to the source voltage VHV via the transistor T24. The input signal DATA is inverted to a logic low signal (DATA1) via the inverter 502 and applied to the gate of the transistor T40. A nominal voltage NV is applied to a gate of the transistor T26 via the transistor T40. The transistor T26 is turned off or significantly weakened due to the nominal voltage NV applied to the gate thereof.

The logic low signal (DATA1) is applied to a gate of the transistor T39. Thus, a sixth node 514 is coupled to the source voltage VHV. Because the transistor T39 is weak, a current through the transistor T27 via the transistor T39 is reduced. The logic high input signal DATA is applied to a gate of the transistor T34. The source voltage VHV at the fifth node 516 is applied to a gate of the transistor T35. Thus, the second node 510 is pulled down to the logic low voltage (e.g., VSS) via the transistors T34 and T35 despite the connection of the second node 510 to the source voltage VHV via the transistors T27 and T39. That is, the pull-down of the transistors T34 and T35 overpowers the pull-up of the transistors T39 and T27.

The logic low voltage at the second node 510 is applied to a gate of the transistor T25. The gate of the transistor T25 transitions to the logic low voltage relatively quickly because the pull-down by the transistors T34 and T35 overpowers the weakened transistors T39 and T27. Thus, the transistor T25 couples the first node 512 to the source voltage VHV via the transistor T24. That is, when the input signal DATA transitions to a logic high signal, the output OUT is pulled up to the source voltage VHV via the transistors T24 and T25.

Conversely, when the input signal DATA is a logic low signal (e.g., 0) or transitioning from a high to low, the transistors T21 and T22 are turned on and the transistor T23 is turned off. That is, the transistor T21 couples a fourth node 508 to the logic low voltage (e.g., 0, VSS). The transistor T23 isolates the fourth node 508 from the first node 512. The logic low voltage at the fourth node 508 is applied to a gate of the transistor T26 which couples the sixth node 514 to the source voltage VHV. The nominal voltage NV is applied to a gate of the transistor T24 via the transistor T41. That is, the transistor T24 is turned off or significantly weakened.

The logic low input signal DATA is applied to a gate of the transistor T38 which couples the fifth node 516 to the source voltage VHV. However, because the transistor T38 is relatively weak, a current through the transistor T25 is reduced. The inverted input signal DATA1 is applied to a gate of the transistor T36. The source voltage VHV at the sixth node 514 is applied to a gate of the transistor T37. Thus, the first node 512 is pulled down to the logic low voltage (e.g., VSS) via the transistors T36 and T37 despite the connection of the first node 512 to the source voltage VHV via the transistors T38 and T25. That is, the pull-down of transistors T36 and T37 overpowers the pull-up of the transistors T38 and T25.

The logic low voltage at the first node 512 is applied to the gate of the transistor T27 which turns on the transistor T27 quickly. Thus, the second node 510 is coupled to the source voltage VHV via the transistors T26 and T27. Accordingly, for a logic low input signal DATA, the complementary output OUT1 measured at the second node is pulled up to the source voltage VHV.

Advantageously, the fourth node 508 and the third node 506 are isolated from the first node 512 and the second node 519, respectively, via the respective transistors T23 and T22. Thus, the pull-down transistors T20 and T21 are able to quickly turn off (or significantly weaken) the pull-up transistors T24 and T26, respectively. For example, when the input signal is a logic high, the third node is pulled down by the transistor T20 while isolated from the second node via the transistor T22. Similarly, when the input signal DATA is a logic low, the fourth node is pulled down by the transistor T21 while isolated from the first node 512 via the transistor T23. Once these nodes are isolated, the respective pull-up transistors T24 and T26 can be used to pull-up the first node 512 and the second node 510, respectively, very quickly.

To increase a speed of the voltage pull-down via the transistors T20 and T21, the nominal voltage NV applied to the gate of the transistors T24 and T26 via the transistors T40 and T41, respectively, can be increased. That is, an increased voltage applied to the gate of the transistors T24 and T26 more quickly turns off (or weakens) the transistors T24 and T26 such that the respective pull-down transistors T20 and T21 overpower the transistors T24 and T26 more quickly. Thus, the level shifter 500 provides an increased speed of the pull-down to VSS. The level shifter 500 also provides an improved reliability and performance compared to conventional level shifters. Moreover, the level shifter 500 enables use in high voltage applications as discussed herein.

Figure 6:
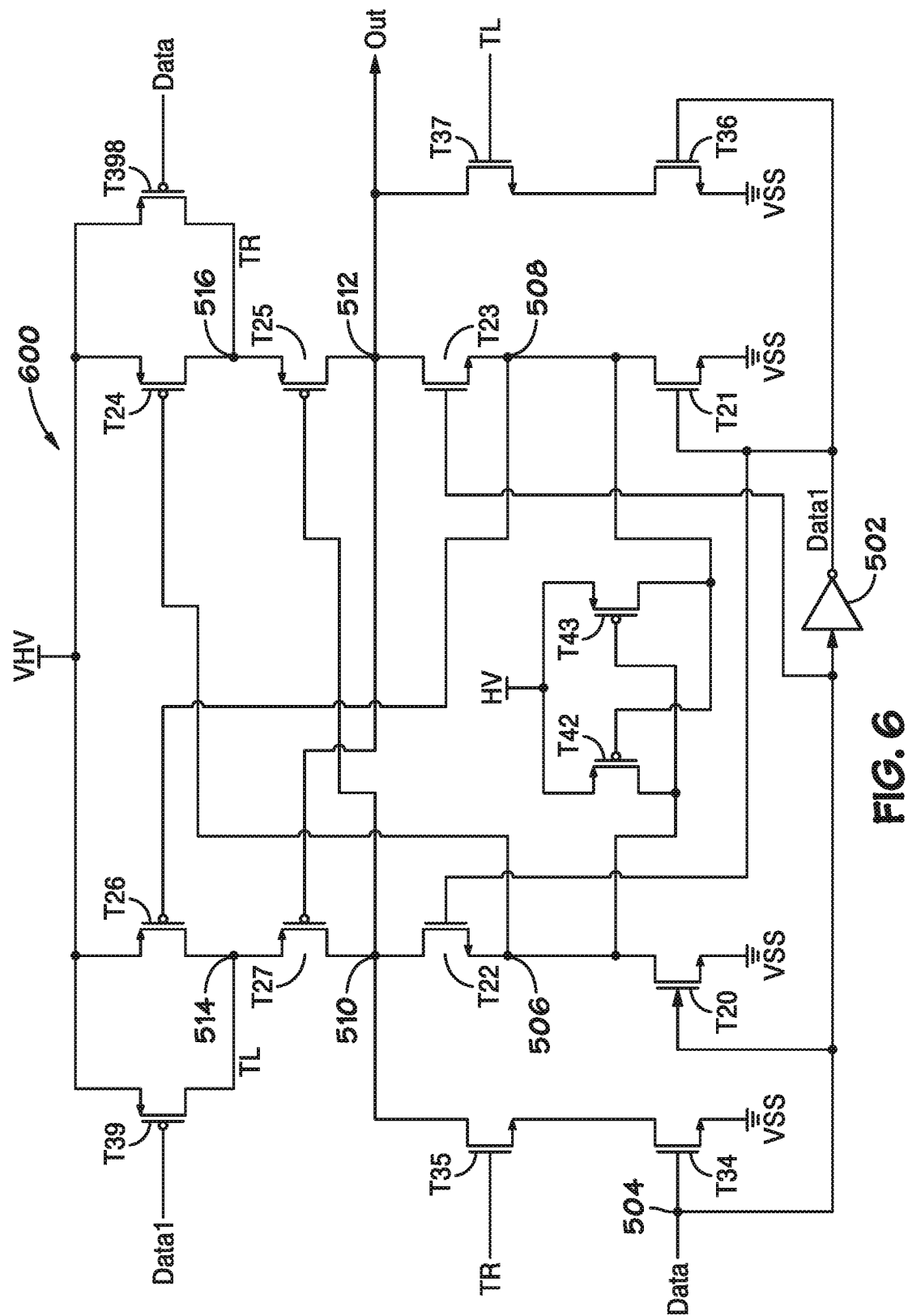
FIG. 6 is a circuit diagram of a high-speed efficient level shifter, according to a fourth embodiment of the disclosure.

FIG. 6 is a circuit diagram of an alternative high-speed efficient level shifter 600, according to an embodiment of the disclosure. The level shifter 600 may correspond to the level shifter 13 discussed with respect to FIG. 1. For example, the high-speed level shifter 600 may be located in the I/O interface 16, the datapath 46, the command interface 14, or any combination thereof. The level shifter 600 is similar to the level shifter 500 discussed with respect to FIG. 5 except that the level shifter 600 does not include the transistors T40 and T41. Instead, the level shifter 600 includes transistors T42 and T43.

A source of transistors T42 and T43 is coupled to a high voltage HV. The high voltage HV can be any voltage between the nominal voltage NV (e.g., about 1.2 volts) and the source voltage VHV (e.g., about 3 volts). For example, the high voltage HV may be between about 1.7 volts and about 2.5 volts, such as about 2 volts.

As illustrated, a voltage applied to a gate of the transistors T24 and T26 is the high voltage HV depending on whether the input signal DATA is a logic high or a logic low. For example, if the input signal DATA is a logic high, the high voltage HV is applied to the gate of the transistor T26 via the transistor T43. Conversely, if the input signal DATA is a logic low, the high voltage HV is applied to the gate of the transistor T26 via the transistor T42.

Advantageously, the level shifter 600 applies a higher voltage to the gate of the pull-up transistors T24 and T26 which increases a speed of turning off (or weakening) the transistors T24 and T26. Thus, speed at which the pull-down transistors T20 and T21 overpower the transistors T24 and T26, respectively, and pull-down the respective nodes 510 and 512 to VSS is improved.

Figure 7:
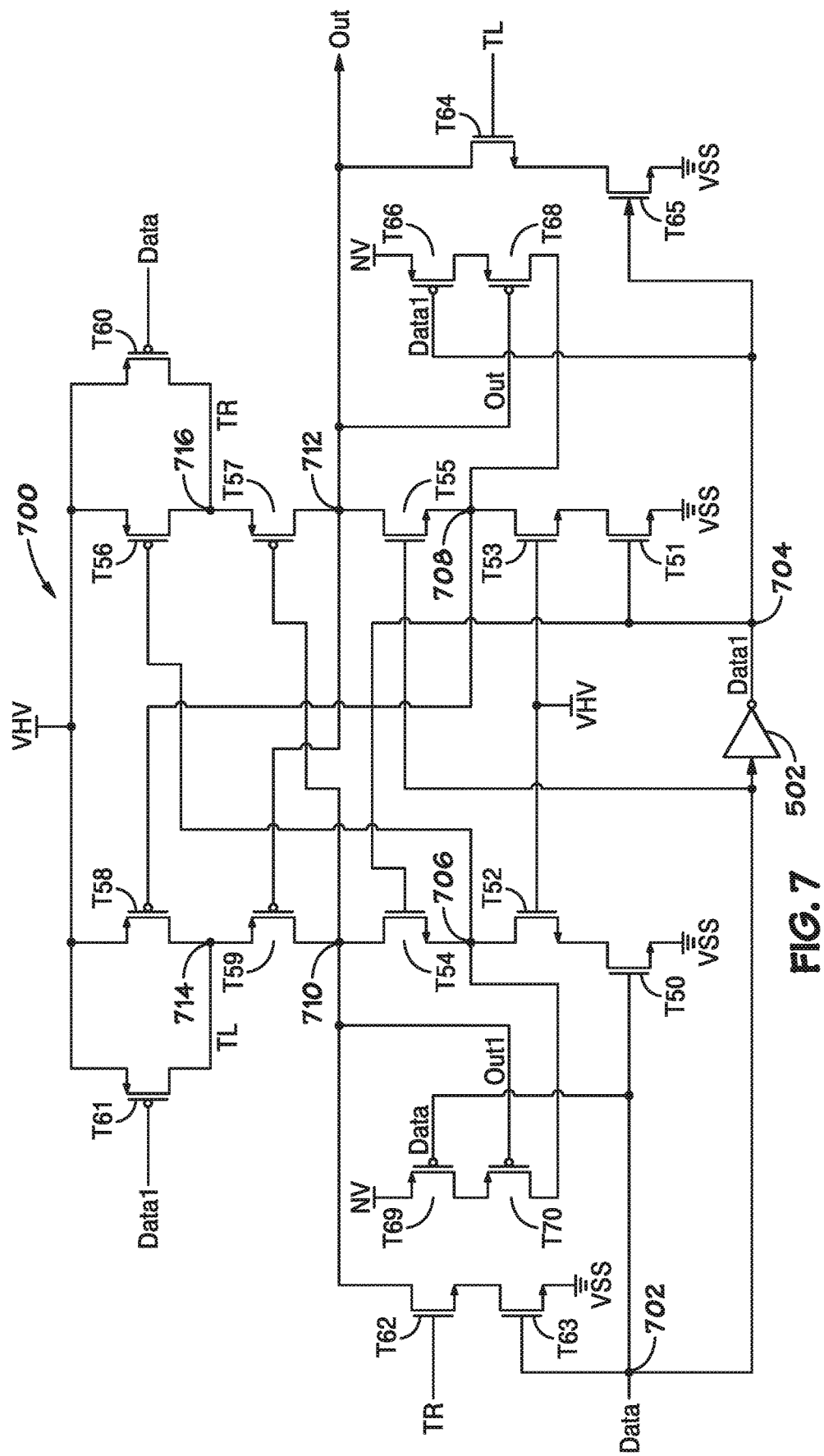
FIG. 7 is a circuit diagram of a high-speed efficient level shifter, according to a fifth embodiment of the disclosure.

FIG. 7 is a circuit diagram of an alternative high-speed efficient level shifter 700, according to an embodiment of the disclosure. The level shifter 700 may correspond to the level shifter 13 discussed with respect to FIG. 1. For example, the high-speed level shifter 700 may be located in the I/O interface 16, the datapath 46, the command interface 14, or any combination thereof.

As illustrated, the level shifter 700 includes transistors T50-T70 and an inverter 502. The level shifter 700 is a combination of the level shifters 300, 400, 500, and 600 discussed with respect to FIGS. 3, 4, 5, and 6, respectively. For example, the transistors T54 and T55 function similar to the transistors T22 and T23 discussed with respect to FIGS. 5 and 6. That is, the transistor T55 isolates a first node 712 from a fourth node 708 while the transistor T54 isolates a second node 710 from a third node 706.

The transistors T52 and T53 function similar to the transistors T22 and T23 discussed with respect to FIG. 3 to improve the pull-down of the transistors T50 and T51 by overpowering the pull-up transistors T56 and T58. The transistors T69 and T70 provide an increased voltage (NV) to a gate of the transistor T56 to turn off (or weaken) the transistor T58 such that the pull-down transistor T51 pulls down first node to VSS more quickly. Similarly, the transistors T66 and T68 provide an increased voltage (NV) to a gate of the pull-up transistor T56 to turn off (or weaken) the transistor T58 such that the pull-down transistor T50 pulls the second node 710 down to VSS more quickly.

Advantageously, the level shifter 700 combines the improved efficiencies and speed improvements of the level shifters 300, 400, 500, and 600 discussed above. The level shifter 700 provides a significant improvement in pull-down speed and efficiency, even though the level shifter 700 may consume an increased layout size.

Advantageously, the embodiments disclosed herein provide a symmetric pull-up speed compared to a pull-down speed. That is, the pull-up speed is increased for high-speed operation of the corresponding memory device. The increase in pull-up speed provides a balanced rise and fall time for the input, even though the level shifters described herein may consume an increased layout size and consume more power than other level shifters.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A voltage level shifter, comprising:
   an input configured to receive a data signal;
   a first node configured to provide an output for the voltage level shifter;
   a first transistor coupled to the first node and configured to selectively couple the first node to a first voltage level based on the data signal;
   a first series arrangement of a second transistor and a third transistor coupled to a second voltage level and configured to selectively couple a second node to the second voltage level; and
   a fourth transistor coupled to the second node and configured to selectively couple the second node to a third voltage level when the second transistor and the third transistor are both activated, wherein the first voltage level, the second voltage level, and the third voltage level are different from each other.

2. The voltage level shifter of claim 1, wherein the first transistor is an n-channel transistor.

3. The voltage level shifter of claim 1, wherein the second transistor, the third transistor and the fourth transistor are p-channel transistors.

4. The voltage level shifter of claim 1, further comprising:
   an inverter configured to invert the data signal at the second node;
   a fifth transistor coupled to the second node and configured to selectively couple the second node to the first voltage level based on the data signal;
   a second series arrangement of a sixth transistor and a seventh transistor coupled to the second node and configured to selectively couple the first node to the second voltage level; and
   an eighth transistor coupled to the first node and configured to selectively couple the second node to the third voltage level when the sixth transistor and the seventh transistor are both activated.

5. The voltage level shifter of claim 4, wherein the first node is coupled to a gate of the eighth transistor and the second node is coupled to a gate of the fourth transistor.

6. The voltage level shifter of claim 5, wherein the first series arrangement is configured to provide a relatively weak connection between the second voltage level and the second node.

7. The voltage level shifter of claim 5, wherein the second series arrangement is configured to provide a relatively weak connection between the second voltage level and the first node.

8. A voltage level shifter, comprising:
   an input configured to receive a data signal;
   a first transistor coupled to a first node and configured to selectively couple the first node to a first voltage level based on the data signal;
   an inverter coupled to the input;
   a second transistor coupled to the inverter and configured to selectively couple a second node to a second voltage level based on the data signal; and
   a third transistor coupled to the second node and configured to selectively couple the first node to a third voltage level, wherein the second voltage level is applied to a gate of the third transistor via the second transistor to decouple the second node from the third voltage level, wherein the first voltage level, the second voltage level, and the third voltage level are different from each other.

9. The voltage level shifter of claim 8, wherein the second voltage level is less than the third voltage level.

10. The voltage level shifter of claim 9, wherein the second voltage level is about 1.2 volts and the third voltage level is about 3 volts.

11. The voltage level shifter of claim 8, further comprising:

a fourth transistor coupled to the inverter and configured to selectively couple the second node to the first voltage level based on the data signal;

a fifth transistor coupled to the input and configured to selectively couple the first node to the second voltage level based on the data signal; and a sixth transistor coupled to the first node and configured to selectively couple the first node to the third voltage level, wherein the second voltage level is applied to a gate of the sixth transistor via the fifth transistor to decouple the first node from the third voltage level.

12. The voltage level shifter of claim 11, wherein the third transistor is weak relative to the first transistor and the sixth transistor is weak relative to the fourth transistor.

13. The voltage level shifter of claim 11, wherein the first transistor and the fourth transistor are n-channel transistors.

14. The voltage level shifter of claim 13, wherein the second transistor, the third transistor, the fifth transistor, and the sixth transistor are p-channel transistors.

15. A voltage level shifter, comprising:
an input configured to receive a data signal;
an inverter coupled to the input;
a first node configured to provide an output for the voltage level shifter;
a second node configured to provide a complimentary output for the voltage level shifter;
a first transistor coupled to a third node and configured to selectively couple the third node to a first voltage level;
a second transistor coupled to the second node and configured to selectively couple the second node to the third node based on the data signal;
a third transistor coupled to the third node and configured to selectively couple the first node to a second voltage level;

a fourth transistor coupled to the second node and configured to selectively couple the second node to the second voltage level; and a fifth transistor coupled to a third voltage level and configured to selectively couple the third voltage level to the fourth transistor based on the data signal to cut off a voltage pull-up of the fourth transistor.

16. The voltage level shifter of claim 15, wherein the fifth transistor couples the third voltage level to a gate of the fourth transistor to cut off a pull-up by the fourth transistor to the second voltage level.

17. The voltage level shifter of claim 16, further comprising:
a sixth transistor coupled to the second node and configured to selectively couple the second node to the second voltage level based on the data signal.

18. The voltage level shifter of claim 17, wherein the second node is coupled to the first voltage level via the first transistor despite a connection to the second voltage level via the sixth transistor due to a relatively weak connection between the second voltage level and the second node due to the sixth transistor being smaller than the first transistor.

19. The voltage level shifter of claim 18, wherein the second transistor isolates the second node from the third node based on the data signal.

20. The voltage level shifter of claim 19, further comprising:
a seventh transistor coupled to the second node and configured to selectively couple the second node to the first voltage level, wherein the seventh transistor is configured to overpower a pull-up of the fourth transistor to the second voltage level and pull-down the second node to the first voltage level.

* * * * *